United States Patent [19]
Yabe et al.

[11] Patent Number: 5,608,674
[45] Date of Patent: Mar. 4, 1997

[54] SEMICONDUCTOR MEMORY DEVICE

[75] Inventors: Tomoaki Yabe, Kawasaki; Kenji Numata, Yamato, both of Japan

[73] Assignee: Kabushiki Kaisha Toshiba, Kawasaki, Japan

[21] Appl. No.: 423,755

[22] Filed: Apr. 18, 1995

[30] Foreign Application Priority Data

Apr. 20, 1994 [JP] Japan .................................. 6-081455

[51] Int. Cl.$^6$ .................................................. G11C 7/00
[52] U.S. Cl. .................... 365/189.05; 365/193; 365/194; 365/221
[58] Field of Search .............................. 365/189.05, 193, 365/194, 221, 230.06

[56] References Cited

U.S. PATENT DOCUMENTS 5,014,245  5/1991  Muroka et al. ......................... 365/193
5,031,150  7/1991  Ohsawa .................................. 365/193

Primary Examiner—Son T. Dinh
Attorney, Agent, or Firm—Banner & Witcoff, Ltd.

[57] ABSTRACT

A semiconductor memory device comprises a memory cell array including a plurality of memory cells, each having a data storage capacitor and a MOS transistor, arranged in rows and columns, a plurality of word lines connected to the memory cells in a direction of the rows, a row decoder for decoding a row address signal synchronized with a /RAS signal for selecting one of the word lines corresponding to an arbitrary one of the rows, a plurality of sense amplifiers, provided to have the same number as the number of the columns, for sensing data read out from the memory cells, a plurality of transfer gates connected to the sense amplifiers, a plurality of data latch circuits connected to the transfer gates, to latch the data sensed by the sense amplifiers through the transfer gates, a plurality of column selection gates connected to the data latch circuits for selecting at least one of the data latch circuits, a column decoder for decoding a column address signal for selecting an arbitrary one of the columns to switch-control the column selection gates, and a row controller controlling the row decoder to activate the one of the word lines and inactivate the same at a predetermined timing which falls within the period after the sense amplifiers are stabilized in an activated state and before the /RAS signal is inactivated.

18 Claims, 12 Drawing Sheets

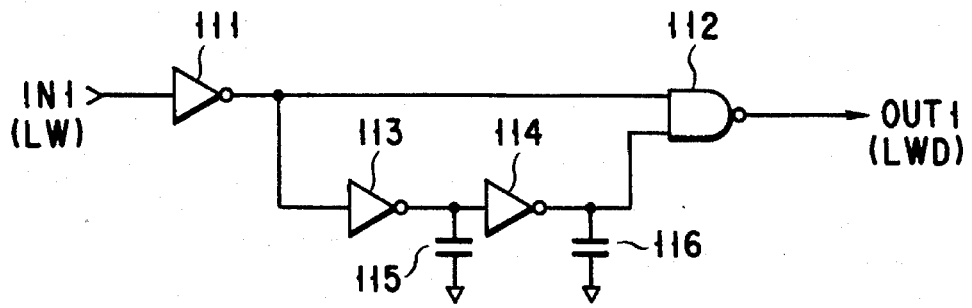
F I G. 10
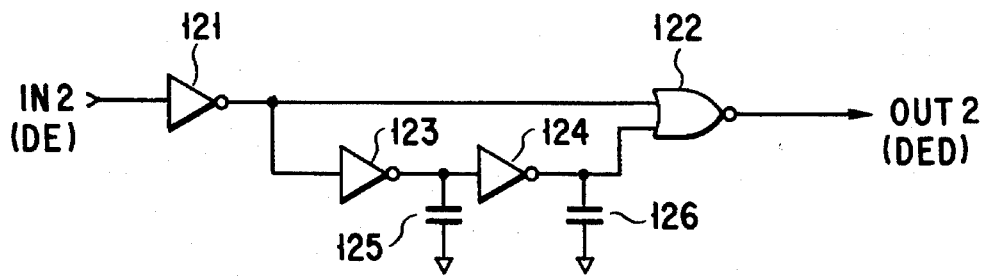
F I G. 11
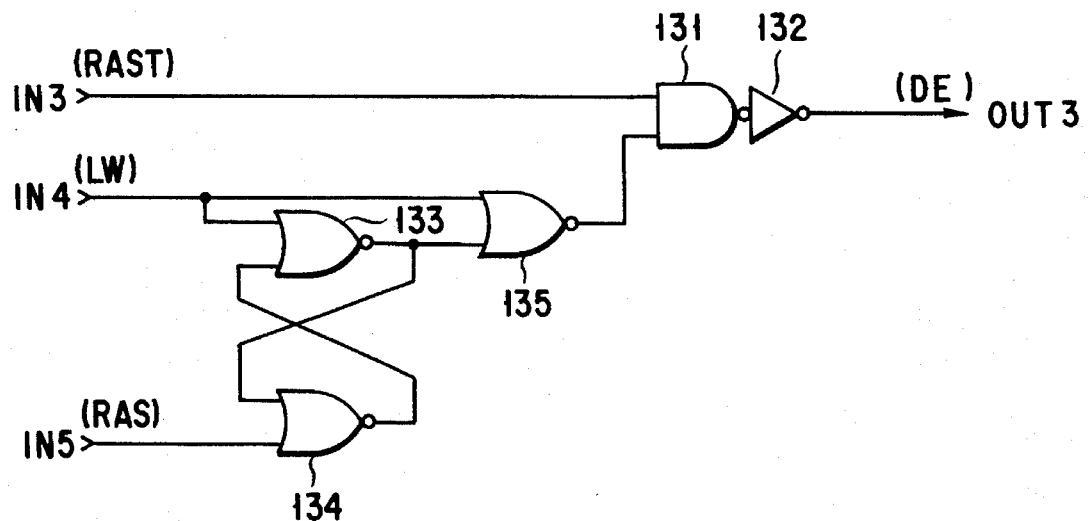
F I G. 12

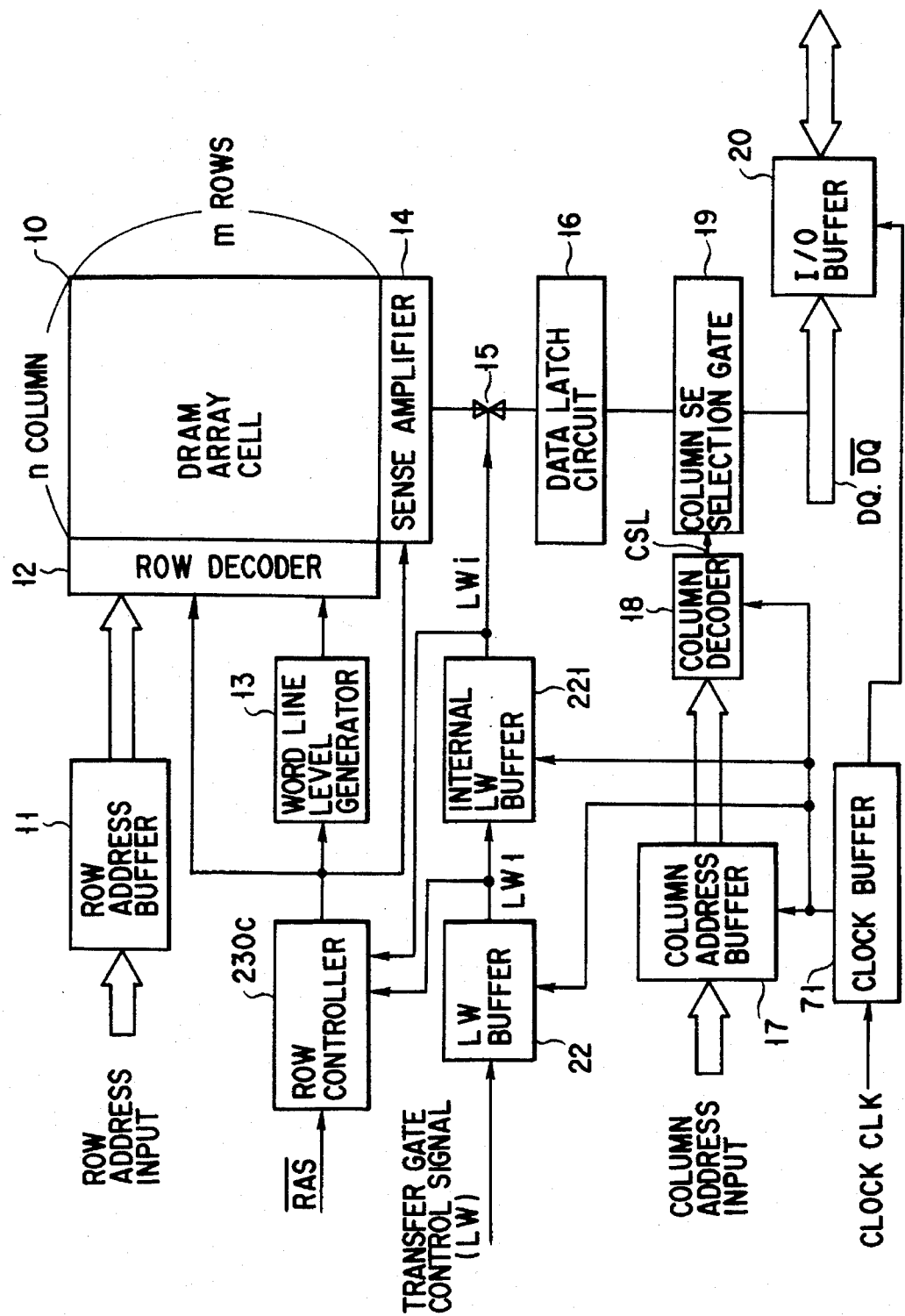
F I G. 13

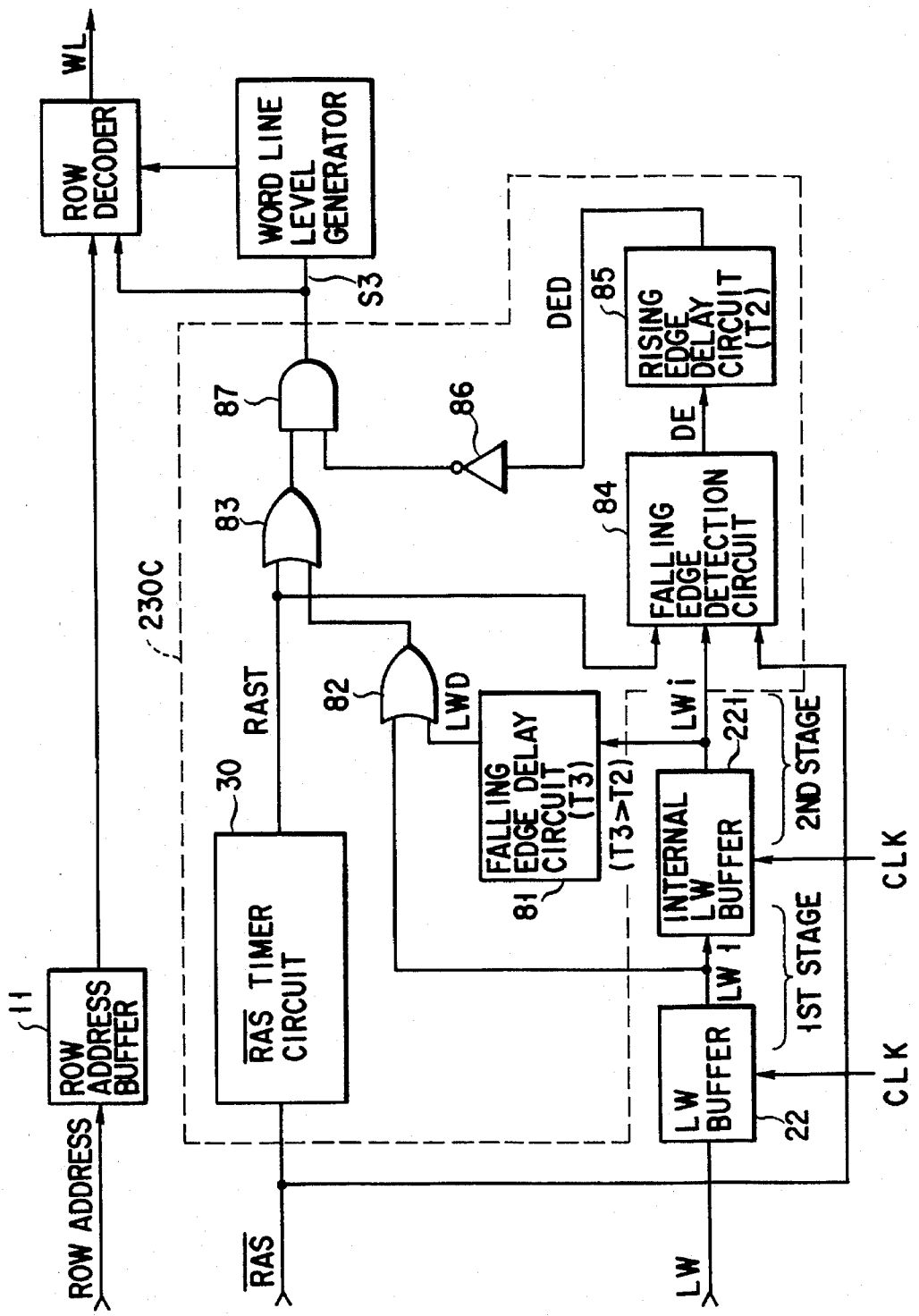
F I G. 14

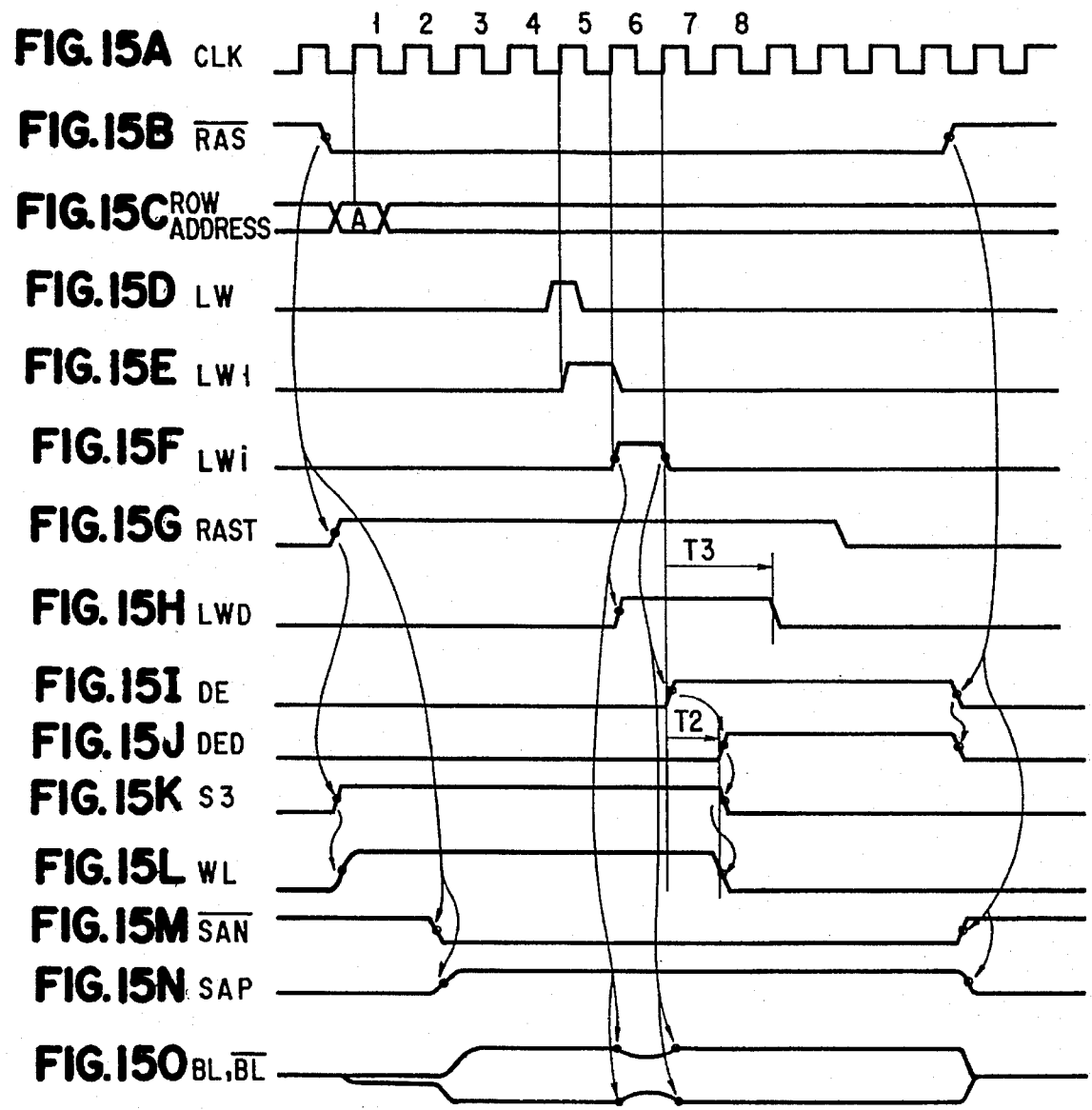

SEMICONDUCTOR MEMORY DEVICE

BACKGROUND OF THE INVENTION

1. Field of the Invention

The present invention relates to a semiconductor memory device and particularly to a dynamic random access memory (DRAM) with a data latch, having a data latch circuit provided in a next stage of a sense amplifier sensing readout data from a memory cell, for transferring data at a high speed between the data latch circuit and a data bus.

2. Description of the Related Art

In accordance with the development of the technology of integrated circuits, semiconductor memory devices, particularly, DRAMs have been widely used in the field of electronics. Since the capacity of DRAM has been enlarged, the use, which requires a large amount of storage capacity as in an image memory, has been developed. However, in this field, it is required that stored data be continuously read at a high speed. When reading out memory data, the most important factor for determining the readout time is time for readout of data from a memory cell to a sense amplifier. There has been made various kinds of contrivances to apparently eliminate such readout time. For example, there is provided a DRAM with a data latch having a latch circuit connected between a sense amplifier and an I/O buffer, wherein a readout data is temporarily held.

FIG. 1 shows a main part of the general structure of a DRAM with a data latch. The DRAM with a data latch comprises a data latch circuit provided in a next stage of the sense amplifier in a memory core section of the widely used standard DRAM. In other words, The DRAM with a data latch comprises a DRAM cell array 10, a row address buffer 11, a row decoder 12, a word line level generator 13, a sense amplifier 14, a transfer gate 15, a data latch circuit 16, a column address buffer 17, a column decoder 18, a column selection gate 19, a data bus DQ, /DQ, an I/O buffer 20, a transfer gate buffer 22, and a row controller 23.

In this case, if the DRAM cell array 10 is structured of m rows and n columns, in the data latch circuit 16, n data latch circuits, which can hold data for one row, are arranged. The above structure is similar to a cache section of Cache DRAM, which has data latch circuits of n columns per one row.

FIG. 2 shows one example showing a circuit corresponding to one column of the DRAM cell array of FIG. 1, a data bus (DQ, /DQ), and a data bus load circuit 21. In FIG. 2, a dynamic memory cell MC has a capacitor C for data storage, and a MOS transistor Q for a charge transfer gate. A word line WL is connected to the memory cells MC of the same row of the memory cell array 10. (BL, /BL) denote a pair of bit lines, (DL, /DL): a data line, (DQ, /DQ): a data bus, LW: a transfer gate control signal, CSL: a column selection control signal, and /LDE: a load control signal.

The following will explain a readout operation, which is conventionally performed in the above-structured DRAM, with reference to FIGS. 1, 2 and a timing waveform of FIG. 3.

At the readout time, a /RAS (row address strobe) signal is activated, and a row address signal is inputted in synchronization with the row address strobe signal. By the activation of the /RAS signal, the row controller 23 is driven. Moreover, a word line boosted voltage, which is normally about 1.5 times higher than a power supply voltage Vcc, is generated by the word line level generator 13. The word line boosted voltage is provided as a power source of the row decoder 12, and the boosted voltage is supplied to the word line WL selected by the row decoder 12.

As mentioned above, if the word line WL is activated, data are readout to the corresponding bit lines BL or /BL from the DRAM cells corresponding to the word line. Moreover, sense amplifier control signals /SAN and SAP, which are generated by the row controller 23. Then, data of n columns on the same row read out to the bit lines BL, /BL are sensed by n number of sense amplifiers 14, and latched therein. Thereafter, the transfer gate control signal LS is activated, so that the transfer gates 15 between the sense amplifiers 14 and the data latch circuits 16 are turned on, and data latched by the sense amplifiers 14 are transferred to the data latch circuits 16. Selected one of latched data of the data latch circuits 16 is passed through the column selection gate 19, which is selected when the column decoder 18 decodes the column address signal input, and outputted to an external data bus through the data bus (DQ, /DQ) and the I/O buffer 20. Further, a bit line equalizer 25 is provided between the sense amplifier 14 and the transfer gate 15, which set the sense amplifier 14 in a precharge state in accordance with an equalizing signal EQ.

In the above operation, the transfer gates 15 are turned off at the time when the data are transferred to the data latch circuits 16, whereby the DRAM cell array 10 and the sense amplifiers 14 can be independently operated from the operation of the data latch circuits 15 and the followings.

By use of the above operation, while transferring of data on the same row are performed between the data latch circuit 16 and the external data bus, a next row address signal is inputted, and new data on the same row corresponding to the new row address are read to the sense amplifier 14 from the cell array 10. Thereby, at the time when the transfer of latched data to the external data bus from the data latch circuit 16 is ended, the transfer gate 15 is turned on again, and new data can be transferred to the data latch circuit 16 from the sense amplifier 14.

In FIG. 3, for example, a data corresponding to the row address A is read out to a bit line pair (BL, /BL) and latched by the sense amplifier 14. When the transfer gate control signal is activated, the data is transferred to the data latch circuit 16 through the transfer gate 15, thus the state of the data line pair (DL, /DL) is renewed and held even after the transfer gate signal is inactivated. In synchronization with /CAS (column address strobe) signal, the data corresponding to the column address Q is read out to the data bus (DQ, /DQ). In the meantime, a data corresponding to the row address B is read out to the bit line pair (BL, /BL) and latched by the sense amplifier 14. When the following one of the transfer gate control signal is activated, the state of the data line (DQ, /DQ) is renewed again. In synchronization with the next one of the /CAS signal, the data corresponding to the column address R is read out to the data bus (DQ, /DQ).

Therefore, when the DRAM is viewed from the external bus side, there seemingly disappears the time (normally 50 ns or more) which is necessary to read out data corresponding to the row address input from the DRAM array 10 to the sense amplifier 14. In other words, after a short period of time (for example, within 10 ns), which is required to turn off the transfer gate 15 after the transfer gate 15 is turned on to transfer data to the data latch circuit 16 from the sense amplifier 14, new data can be read out again from the data latch circuit 16. In the example of FIG. 3, a new data is read out after 20 ns.
}

However, there were problems in the above-explained the conventional word line driving system of DRAM with data latch as follows.

As mentioned above, the word line WL is activated, data is read out to the sense amplifier 14 from the memory cell MC. Then, data is transferred to the data latch circuit 16, and synchronized with the rising edge of the /RAS signal, and the word line WL is inactivated. Sequentially, the sense amplifier activation signals /SAN and SAP are inactivated, and the voltages of the pair of the bit lines (BL, /BL), which are connected to the pair of input/output terminals of the sense amplifiers 14, are equalized by an equalizer 25, activated by an equalizing signal EQ which is synchronized with the pulse edges of the /RAS signal. In this case, if the word line WL is once activated, the word line is normally set to be in the activated state up to the rising edge of the /RAS signal for 60 ns or more.

Therefore, a ratio of the time in which the word line boosted voltage is applied to a gate insulating film of the MOS transistor Q for a transfer gate of the memory cell MC connected to the word line WL to the total operating time, that is, a duty ratio is increased. Due to this, it is difficult to ensure a long-time reliability of the gate insulating film. Moreover, there must be correspondingly increased test time for performing a screening test of the gate insulating film in a wafer state or after the packaging. Due to this, a test cost is increased.

SUMMARY OF THE INVENTION

An object of the present invention is to provide a semiconductor memory device with a data latch wherein a duty ratio of the time when a word line boosted voltage is applied to a gate insulating film of a charge transfer MOS transistor of the memory cell connected to a word line to the total operating time is small, a long period of reliability of a gate insulating film can be attained readily, test time for performing a screening test of the gate insulating film can be shortened, and test cost can be reduced.

In order to attain the above object, the semiconductor memory device of this invention comprises: a memory cell array including a plurality of dynamic memory cells, each having a data storage capacitor and a MOS transistor for an electrical charge transfer gate, arranged in a form of rows and columns; a plurality of word lines connected to the memory cells of the memory cell array in a direction of the rows; a row decoder for decoding a row address signal in synchronization with a /RAS signal for selecting one of the word lines corresponding to an arbitrary one of the rows of the memory cell array; a plurality of sense amplifiers, provided to have the same number as the number of the columns of the memory cell array, for sensing data read out from the memory cells connected to the one of the word lines selected by the row decoder through a plurality of bit lines, respectively; a plurality of transfer gates connected to the sense amplifiers, respectively; a plurality of data latch circuits, provided to have the same number as the number of the columns of the memory cell array and connected to the transfer gates, respectively, to latch the data sensed by the sense amplifiers through the transfer gates; a plurality of column selection gates connected to the data latch circuits, respectively, for selecting at least one of the data latch circuits; a column decoder for decoding a column address signal for selecting an arbitrary one of the columns of the memory cell array to switch-control the column selection gates; and a row controller controlling the row decoder so as to activate the one of the word lines selected by the row decoder and sequentially inactivate the same at a predetermined timing, the predetermined timing falling within the period of time after the sense amplifiers are stabilized in an activated state and before the /RAS signal is inactivated.

In this case, if data transfer from the sense amplifier to the data latch circuit is not ended before the predetermined fixed time passes after the word line selected by the row decoder is set to be in the activated state, it can be controlled that the word line can be automatically set to be an inactivated state after the fixed time passes. Also, if data transfer from the sense amplifier to the data latch circuit is ended before the fixed time passes, it can be controlled that the word line can be automatically set to be an inactivated state before the fixed time is passed.

Thereby, the duty ratio of the time in which the word line boosted voltage is applied to the gate insulating film of the charge transfer MOS transistor of the memory cell connected to the word line to the total operating time is smaller than the conventional case. Also, the long period of reliability of the gate insulating film can be attained readily, test time for performing the screening test of the the gate insulating film can be shortened, and test cost can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a circuit diagram showing one example of a falling edge delay circuit used in the row controller of the present invention;

FIG. 11 is a circuit diagram showing one example of a rising edge delay circuit used in the row controller of the present invention;

FIG. 12 is a circuit diagram showing one example of a falling edge detection circuit used in the row controller of the present invention;

FIG. 13 is a block diagram showing the main structure of a DRAM with a data latch circuit of a third embodiment of the present invention;

FIG. 14 is a block diagram showing a row controller of the DRAM with a data latch circuit of the third embodiment of the present invention; and FIGS. 15A–15O are timing waveforms showing one example of a readout operation of the DRAM of the third embodiment of the present invention.

DETAILED DESCRIPTION OF THE PREFERRED EMBODIMENTS

Embodiments of the presents invention will be explained with reference to the drawings.
(First Embodiment)

Figure 1:
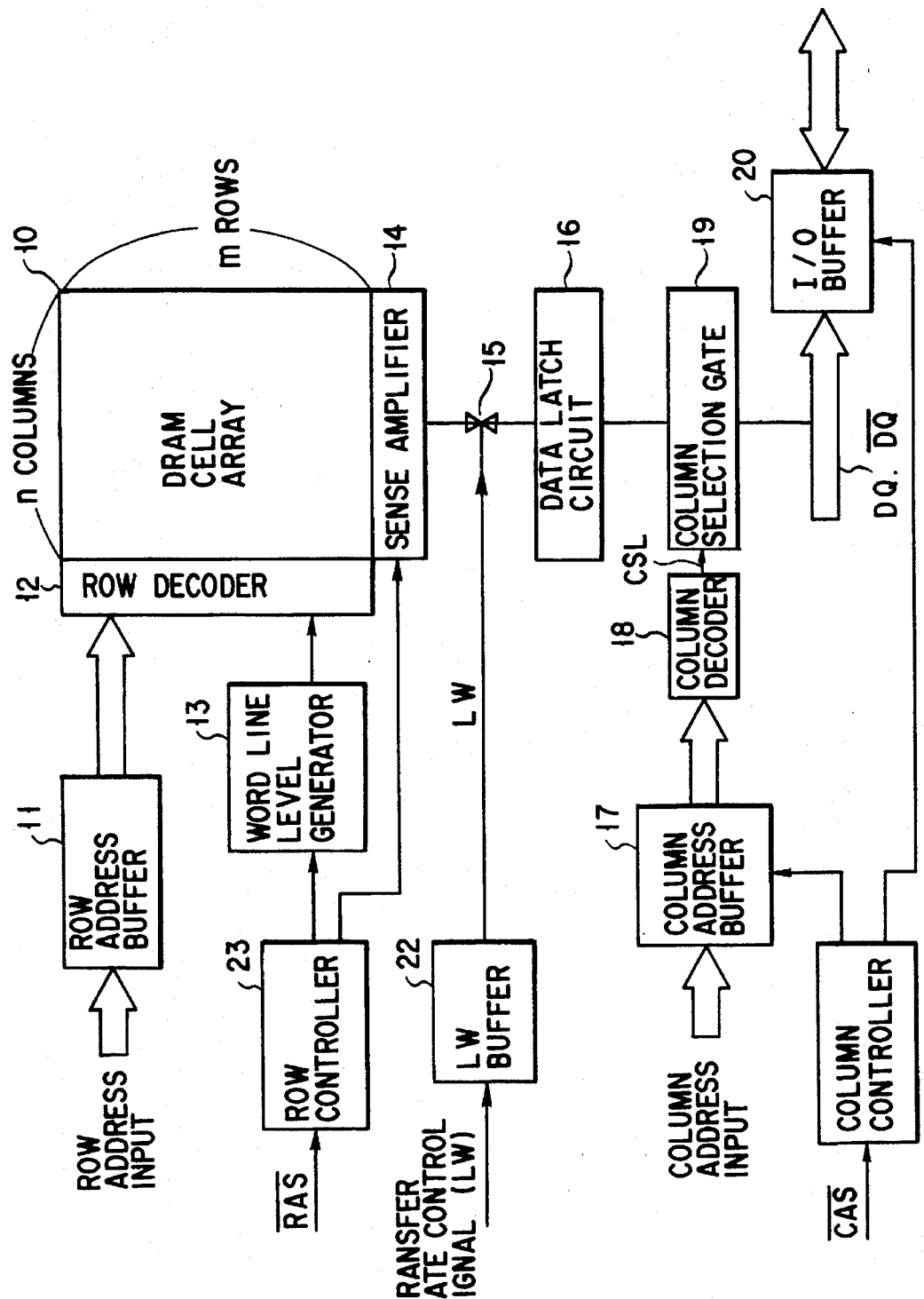
FIG. 1 is a block diagram showing the conventional structure of a DRAM with a data latch circuit.
Figure 4:
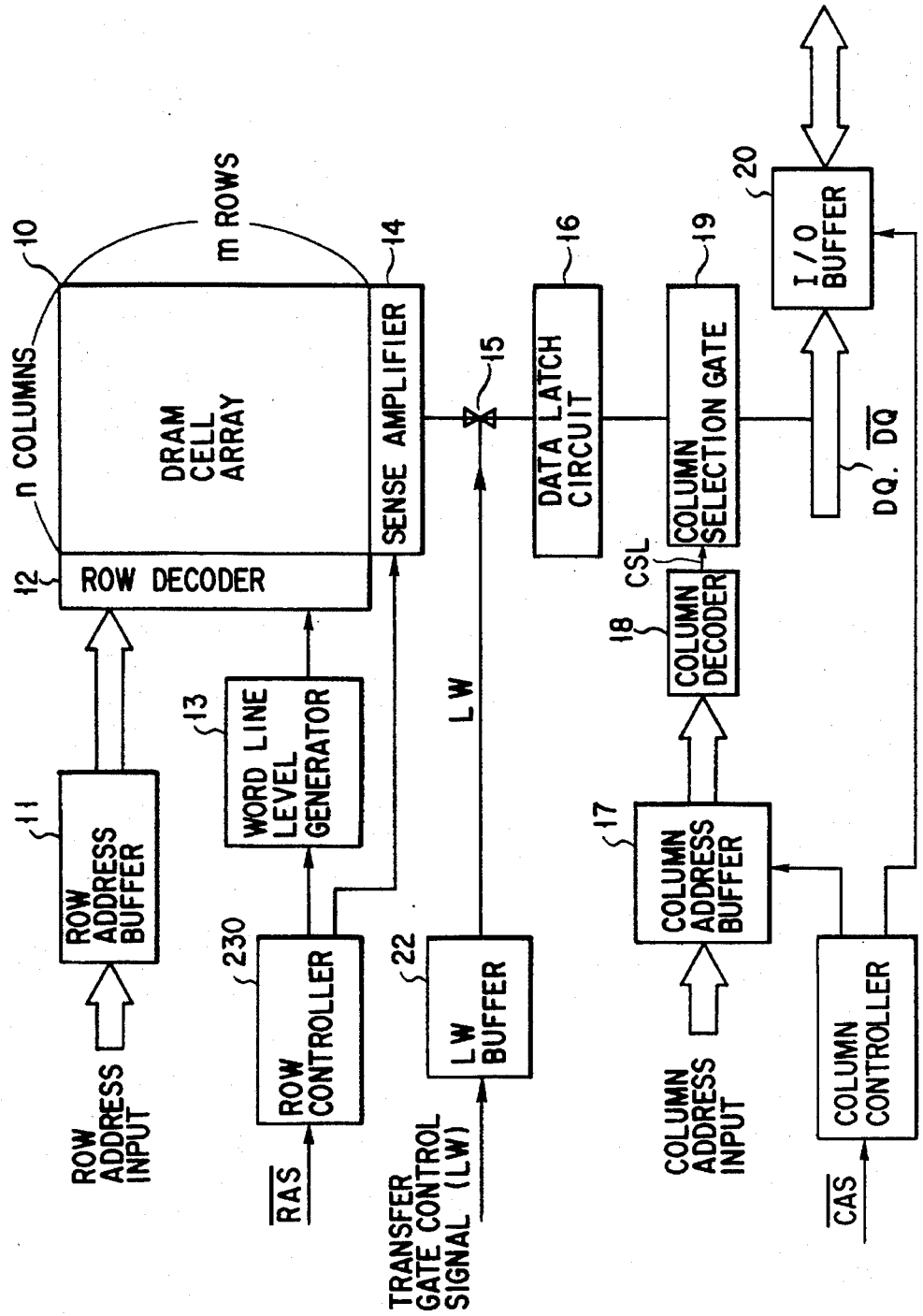
FIG. 4 is a block diagram showing the main structure of a DRAM with a data latch circuit of a first embodiment of the present invention.

FIG. 4 shows the structure of the main parts of a DRAM with a data latch of a first embodiment of the present invention. As compared with the conventional DRAM with a data latch, the structure of a row controller 230 differs from that of the case. Since the other portions than the row controller are the same as the conventional ones, the same reference numerals are added to the same portions as the case of FIG. 1. In FIG. 4, reference numeral 10 is a memory cell array where the dynamic memory cells are arranged in a matrix form of m rows×n columns; 11: a row address buffer, and 12: a row decoder for decoding a low address signal for selecting the word line WL of an arbitrary row of the memory cell array 10.

Figure 5:
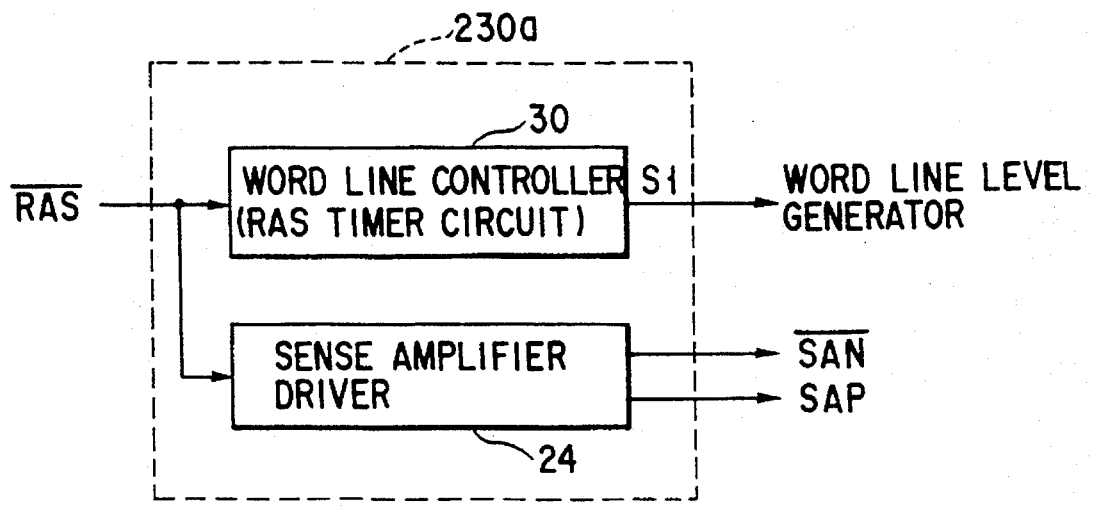
FIG. 5 is a block diagram showing a row controller of the DRAM with a data latch circuit of the first embodiment of the present invention.

As shown in FIG. 5, the row controller 230 (230a in this embodiment) comprises a word line controller 30 and a sense amplifier driver 24. The word line controller 30 receives a /RAS signal and outputs a control signal S1, which controls the activated period of the word line WL selected by the row decoder 12 to a predetermined period of time. The sense amplifier driver 24 generates sense amplifier control signals /SAN SAP, which are delayed by a predetermined time from the activation timing of the /RAS signal.

Figure 6:
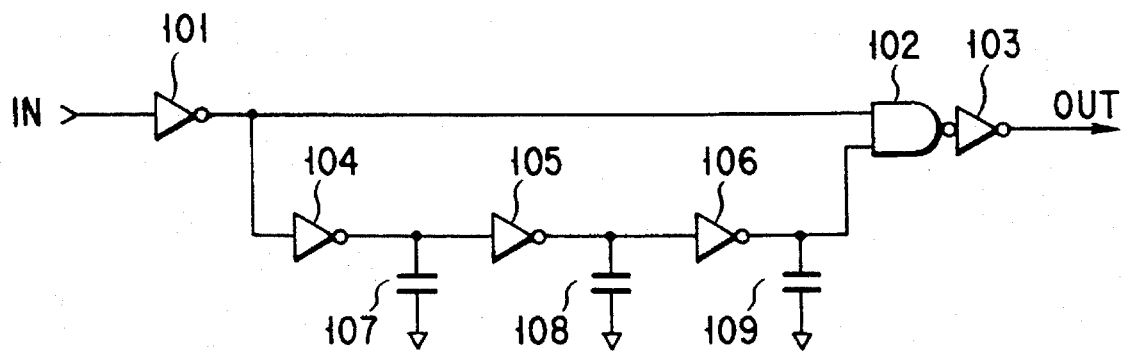
FIG. 6 is a circuit diagram showing one example of a /RAS timer circuit used in the row controller of the present invention.

A /RAS timer circuit is used as the word line controller 30. The /RAS timer circuit is synchronized with the front edge (falling edge) of the pulse of the RAS signal when the /RAS signal is inputted thereto and generates the control signal S1, which is set to be in a "H" level for a predetermined period of time TWD1 which is shorter than a pulse width (activated period) of the RAS signal, supplying the control signal S1 to the word line level generator 13. A circuit shown in FIG. 6 can be used as a specific example of the /RAS timer 30. This circuit is operated as follows.

The /RAS signal is inputted from the input terminal IN, and a signal inverted by an inverter 101 is inputted to one input terminal of an NAND gate 102. Also, the same signal is delayed by a delay circuit comprising inverters 104 to 106 and capacitors 107 to 109, a level of the signal is inverted, and the inverted signal is inputted to the other input terminal of the NAND gate 102. An output of the NAND gate 102 is outputted to an output terminal OUT through an inverter 103. Thereby, there can be obtained the timer circuit, which is structured to rise at the falling edge of the /RAS signal (activation) and fall after a fixed period of time TWD1. As for the sense amplifier driver 24, a well-known driving circuit is usable.

The word line level generator 13 is driven during the activated period of the control signal S1, and generates a word line boosted voltage (normally about 1.5 times higher than a power supply voltage Vcc), a little later than the activation timing of the control signal S1, to be supplied as a power source of the row decoder 12. Then, the level boosting operation of the generator 13 is ended to be synchronous with the inactivation of the control signal S1. Therefore, the row decoder 12 is driven during the activated period of the control signal S1, and starts the decoding operation of the row address signal a little later than the activation timing of the control signal S1, and ends the decoding operation to be synchronous with the inactivation of the control signal S1. As for the word line level generator 13, a conventional generator circuit can be used.

Figure 2:
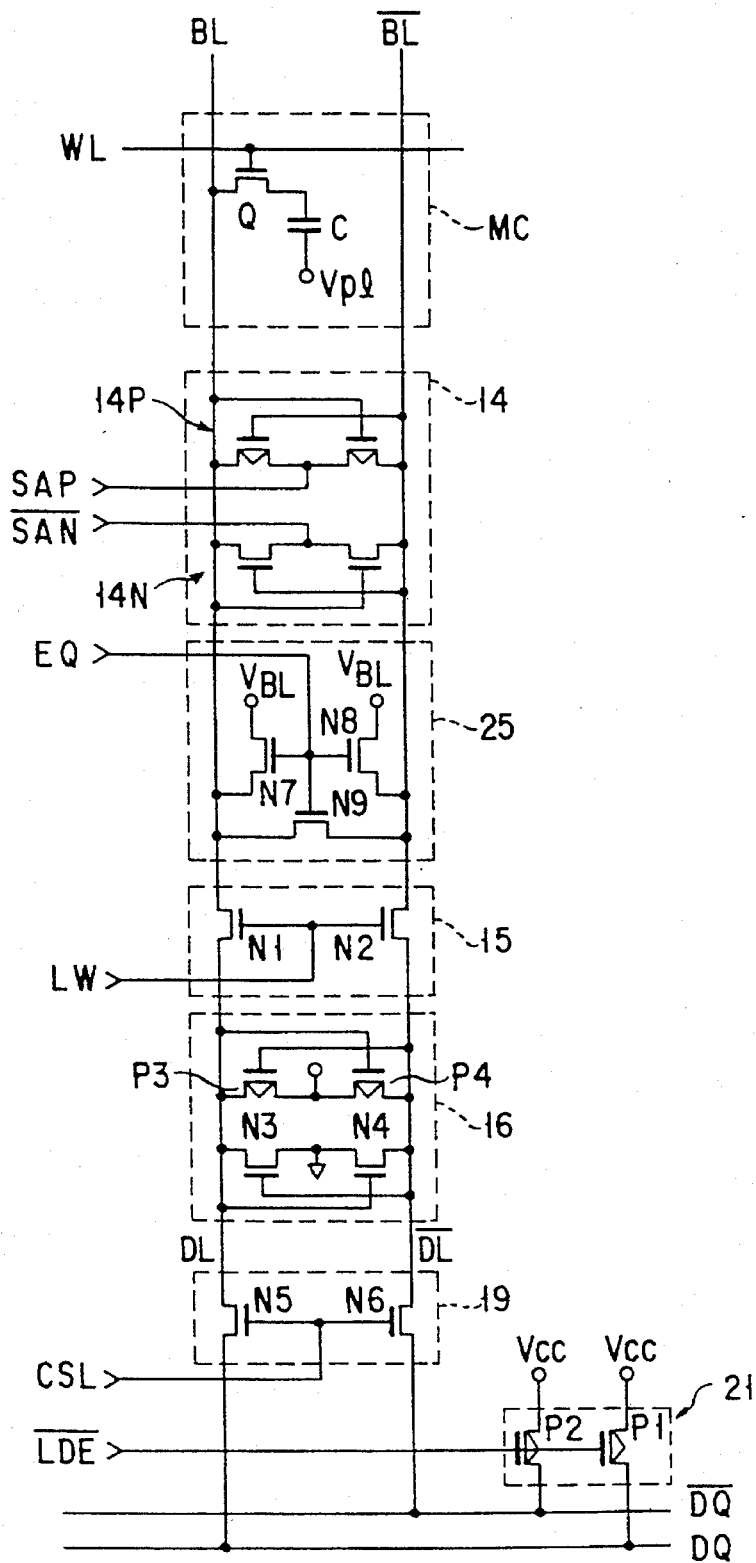
FIG. 2 is a circuit diagram showing one example of a generally used circuit corresponding to one column of a DRAM cell array and a data bus load circuit.

In FIG. 4, reference numeral 14 denotes sense amplifiers, which are provided to have the same number of the columns (n) of the memory cell array 10, senses data for one row read out from the memory cells of the row selected by the row decoder 12 to be temporarily stored. (DL, /DL) in FIG. 2 are data line pairs connected to the plurality of sense amplifiers 14, respectively.

Reference numeral 16 denotes data latch circuits, which are provided to have the same number of the columns (n) of the memory cell array 10. The data latch circuits 16 are connected to the plurality of data line pairs (DL, /DL), respectively, and latch data of each data line pair as shown in FIG. 2.

Reference numeral 15 denotes a plurality of transfer gates, which are inserted to the data line between a plurality of the data latch circuits 16 and a plurality of the sense amplifiers 14, respectively.

Reference numeral 17 is a column address buffer. Reference numeral 18 is a column decoder, which decodes a column address signal for selecting an arbitrary column of the memory cell array 10. Reference numeral 19 denotes a plurality of column selection gates, which are inserted to the data lines (DL, /DL) on the outside of the data latch circuit 16, respectively. The column selection gates are switch-controlled by the column decoder 18 to select at least one of a plurality of the data latch circuits 16.

Reference numeral 20 is an I/O buffer, which performs transferring of I/O data from and to the data latch circuits 16 selected by the column selection gates 19. (DQ, /DQ) denotes a data bus to connect the I/O buffer 20 to the column selection gates 19. Reference numeral 22 is a transfer gate control signal buffer, which receives a transfer gate control signal LW for controlling the transfer gate 15 to be turned on for a predetermined period of time, and supplies the signal LW to the transfer gate 15.

In this invention the same circuit as the circuit of FIG. 2 can be used as a circuit for one column of the DRAM cell array. In FIG. 2, the dynamic memory cell MC (one memory cell is typically shown) has a capacitor C for data storage and a MOS transistor Q for a charge transfer gate. The word line WL (one word line is typically shown) is connected to all memory cells MC of the same row of the memory cell array 10.

(BL, /BL) are a pair of bit lines, (DL, /DL) a pair of data lines, and (DQ and /DQ) a data bus. N1 and N2 are first MOS transistors for transfer gates 15, and LW is a transfer gate control signal. N5 and N6 are second MOS transistors for column selection gates 19, and CSL is a column selection control signal. The sense amplifier 14 comprises a PMOS sense amplifier 14P and an NMOS sense amplifier 14N. /SAN and SAP are sense amplifier control signals. The data latch circuit 16 comprises PMOS transistors P3 and P4 for a P type latch circuit and NMOS transistors N3 and N4 for an N type latch circuit. The data bus load circuit 21 is connected between the data bus (DQ, /DQ) and the power source VCC. Also, the data bus load circuit 21 comprises PMOS transistors P1 and P2 whose impedance is controlled by a load control signal (/LDE). Moreover, the data bus load circuit 21 precharges the data bus (DQ, /DQ) and the data line pair (DL, /DL) for a predetermined period of time. A bit line equalizer 25 comprised of transistors N7 to N9 is connected between the bit line pairs (BL, /BL). The voltage Vcc/2 is applied to each of terminals VBL, and the equalizing signal EQ is inputted to each gate of the transistors to drive the equalizer 25.

Figure 7:
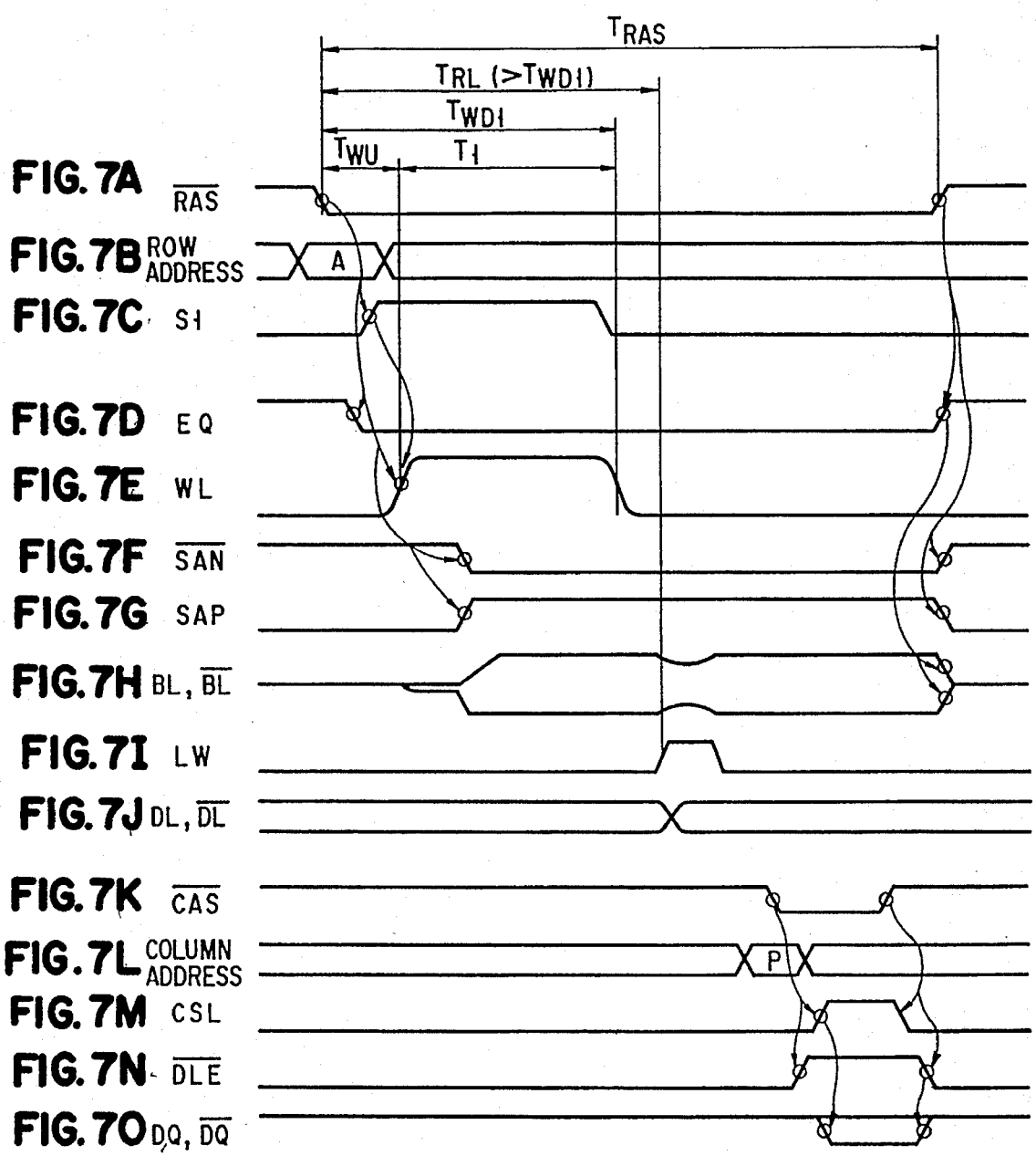
FIGS. 7A–7O are timing waveforms showing one example of a readout operation of the DRAM of the first embodiment of the present invention.

FIG. 7 is a timing waveform showing one example of a readout operation of the DRAM of FIG. 4. The following explains the readout operation of the above-structured DRAM with reference to the timing waveform view.

In FIG. 7, TRAS is a /RAS signal activation time. TWU is a delay time, which is from the time when the RAS signal is activated to the time when the word line WL is activated. T1 is a word line WL activation time which is predetermined by the timer circuit 30 as a fixed time. TWD1 (=TWU+T1) is a first delay time measured from the time when the /RAS signal is activated to the time when the word line WL is inactivated owing to the row decoder 12 controlled by the output signal of the /RAS timer circuit 30 through the word line level generator 13. TRL is a delay time measured from the time when the /RAS signal is activated to the time when the transfer gate control signal LW is activated. The relationship between TRL and TWD1 is set to be TRL>TWD1 according to the system specification.

When the /RAS signal is activated for the readout the row address signal is inputted being synchronized with the activation of the /RAS signal. At the same time, the output S1 of the RAS timer 30 rises to be inputted to the word line level generator 13. The row decoder 12, which receives the output of the word line level generator 13, selects the word line WL after the delay time TWU from the activation timing of the /RAS signal, same as the prior art. Then, the word line boosted voltage is supplied to the selected word line. In this way, if the word line WL is activated, data is read out to the corresponding bit line BL or /BL from the memory cell MC corresponding to the word WL.

Moreover, the sense amplifier control signals /SAN and SAP, which are outputted from the sense amplifier driver 24 driven in synchronization with the activation of the /RAS signal, are activated by a predetermined timing later than the activation timing of the /RAS signal. Data for n columns on the same row readout to the bit lines BL and /BL are sensed by the sense amplifiers 14 and latched, same as the prior art.

Then, after the fixed time T1 since the word line WL is activated, the output S1 of the /RAS timer 30 falls, and the row decoder 12 inactivates the word line WL. In this way, even if the word line WL is inactivated, the sense amplifier control signals /SAN and SAP are maintained to be in the activated state until the /RAS signal is inactivated. The potentials of the bit line pairs (BL, /BL) are not equalized, and the sense amplifiers 14 keep holding latched data.

After the word line WL is inactivated, the transfer gate control signal LW is activated, and the transfer gates 15 between the sense amplifiers 14 and the data latch circuits 16 are turned off. Moreover, data, which are latched by the sense amplifiers 14 are transferred to the data latch circuits 16. The latched data of the data latch circuit 16 is passed through the column selection gate 19, which is selected when the column decoder 18 decodes the column address, and outputted to the outer data bus through the data bus (DQ, /DQ) and the I/O buffer 20.

If the /RAS signal is inactivated after a data is transferred to the data latch circuit 16 and the transfer gate control signal LW is inactivated and the transfer gate 15 is turned off, the sense amplifier control signal /SAN and SAP are also inactivated. At this time, the potentials of the bit line pairs (BL, /BL) are equalized with the potential of, for example, Vcc/2 (Vcc=power supply voltage) by the equalizer 25 in accordance with the equalizing signal EQ, which is synchronized with the /RAS signal.

Figure 3:
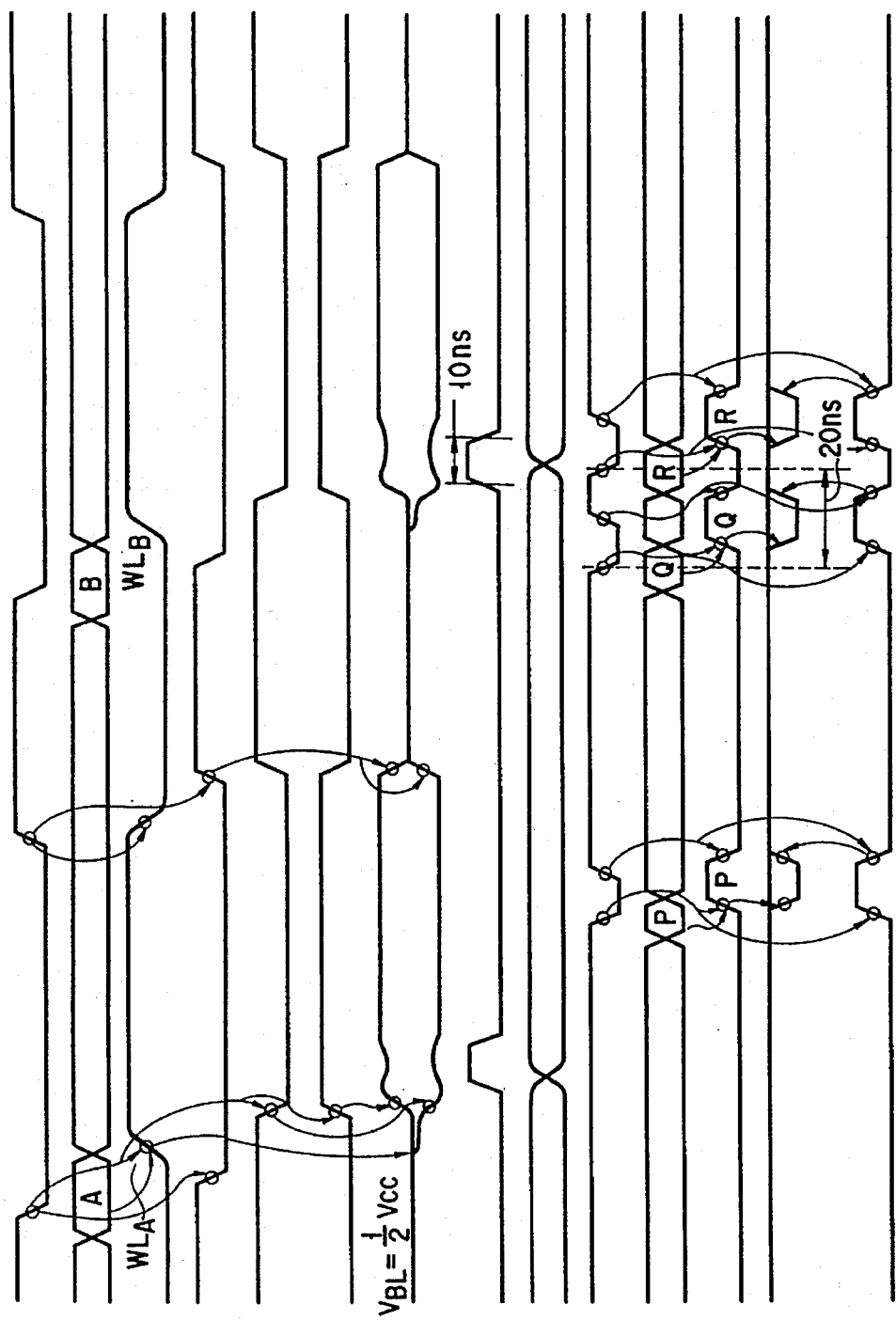
FIGS. 3A–3N are timing waveforms showing one example of a readout operation of a conventional DRAM with a data latch.

By the above-explained operation, similar to the operation of the conventional DRAM with a data latch, data can be read out at a high speed. Moreover, it is possible to limit the time wherein the word line WL is activated by the /RAS timer circuit 30 to the fixed time T1, which is shorter than the /RAS signal activation time TRAS (in the conventional DRAM with a data latch, the word line WL is continued to be activated until the RAS signal is inactivated as shown in FIG. 3).

Thereby, the duty ratio of the time when the word line boosted voltage is applied to the gate insulating film of the charge transfer MOS transistor of the memory cell connected to the word line to the total operating time is smaller than the conventional case. Also, the long period of reliability of the gate insulating film can be attained readily, test time for performing the screening test of the the gate insulating film can be shortened, and test cost can be reduced.

(Second Embodiment)

The first embodiment showed the operation under the condition that the delay time TRL, which is from the time when the /RAS signal is activated to the time when the transfer gate control signal LW is activated, is longer than the first delay time TWD1 (TRL>TWD1). However, the present invention is not limited to the first embodiment. The present invention can be worked as the following second embodiment.

Figure 8:
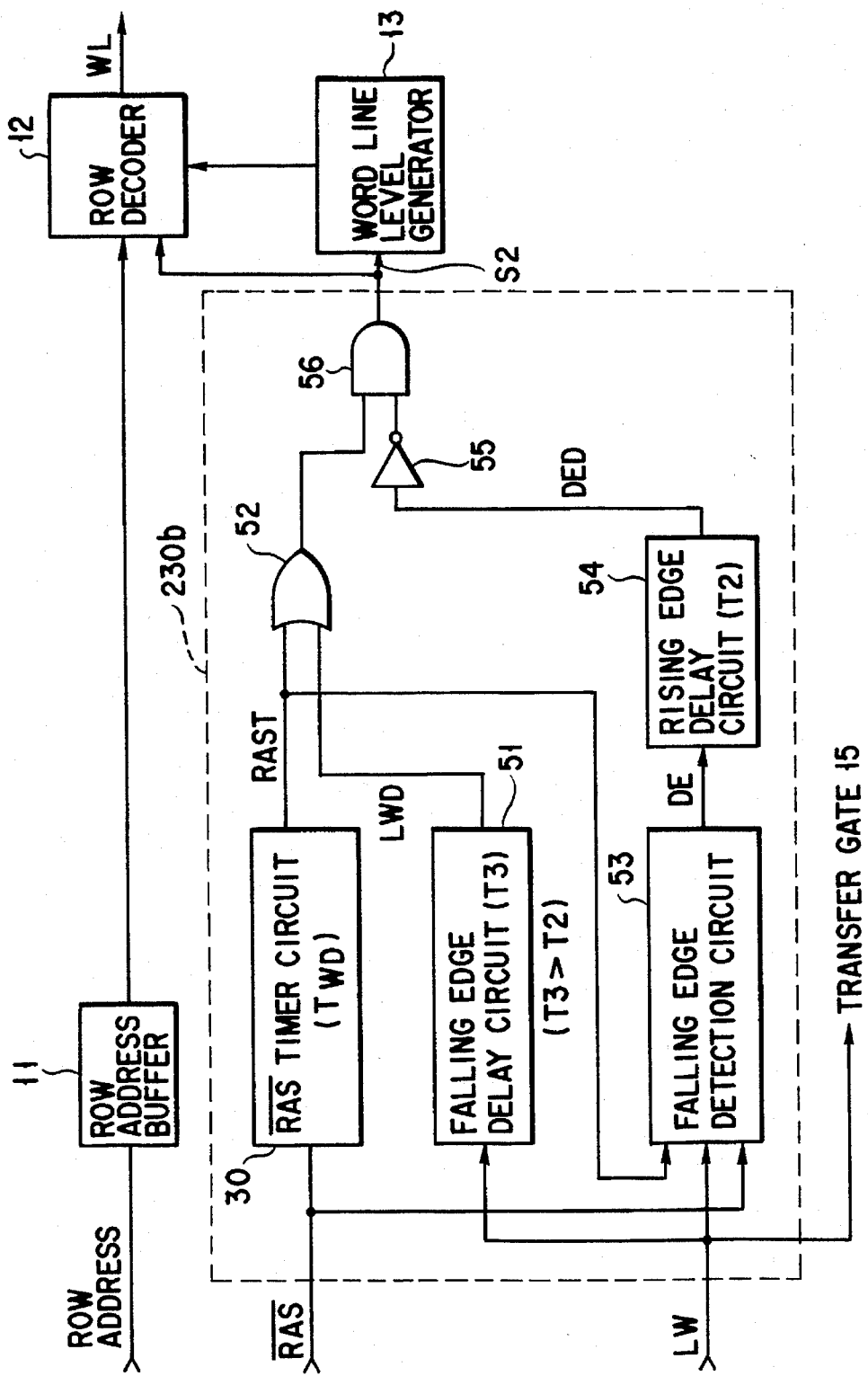
FIG. 8 is a block diagram showing a row controller of a DRAM with a data latch circuit of a second embodiment of the present invention.
Figure 9:
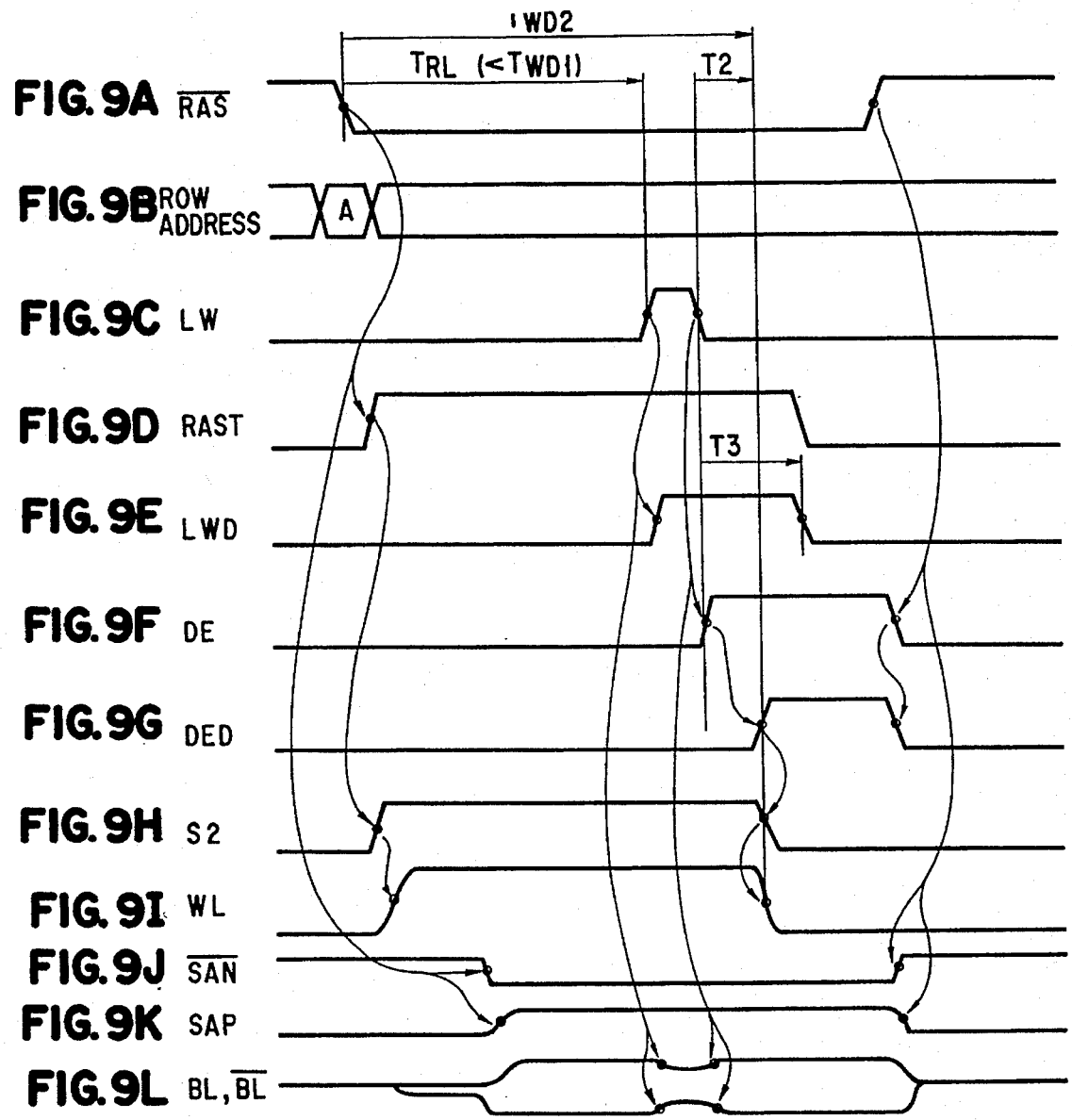
FIGS. 9A–9L are timing waveforms showing one example of a readout operation of the DRAM of the second embodiment of the present invention.

The main structure of the DRAM with a data latch of the second embodiment is the same as the first embodiment of FIG. 4, and the difference therebetween exists in the detailed structure of the row controller 230. The row controller of the second embodiment is shown by reference numeral 230b of FIG. 8, and FIG. 9 shows one example of timing of the readout operation of the DRAM.

The row controller 230b is structured to output a timing control signal S2. The timing control signal S2 controls the timing for setting the word line WL to be in the inactivated state so as to be changed in accordance with whether or not the transfer gate 15 is controlled to be turned on before the predetermined first fixed time T1 passes after the word line WL selected by the row decoder 12 is set to be in the activated state. In other words, before the first delay time TWD1 passes after the /RAS signal is activated, the timing for setting the word line WL to be in the inactivated state is changed in accordance with whether or not the data transfer from the sense amplifier 14 to the data latch circuit 16 is ended.

In a case where the data transfer from the sense amplifier 14 to the data latch circuit 16 is not ended before the predetermined first fixed time T1 passes after the word line WL is set to be in the activated state, the control signal S2 controls the row decoder 12 and the word line level generator 13 such that the word line WL is automatically set to be in the inactivated state after the first fixed time T1.

In contrast, in a case where the data transfer from the sense amplifier 14 to the data latch circuit 16 is ended before the predetermined first fixed time T1 passes after the word line WL is set to be in the activated state (in a period of time after data from the memory cell MC is latched by the sense amplifier 14), the control signal S2 controls the row decoder 12 such that the word line WL is automatically set to be in the inactivated state before the first fixed time T1. In this case, the timing for automatically setting the word line WL to be in the inactivated state is preferably set with the predetermined second fixed time T2 passing after the transfer gate 15 is controlled to be turned off for the reason to be described later.

The readout operation of the DRAM of FIG. 8 is shown in the timing waveform of FIG. 9. This operation is substantially the same as the readout operation of the DRAM of the first embodiment explained with reference to FIG. 7. However, the operation is changed in accordance with whether or not the delay time TRL, which is from the time when the /RAS signal is activated to the time when the transfer gate control signal LW is activated, is longer than first delay time TWD1. In this case, the delay time TRL is a constant, which is fixed by a system requirement using the DRAM.

In other words, as shown in FIG. 7, in a case where the delay time TRL, which is from the time when the /RAS signal is activated to the time when the transfer gate control signal LW is activated, is longer than the first delay time TWD1, the word line WL activation time is limited to the first fixed time T1 similar to the readout operation of the DRAM of the first embodiment.

In a case where the delay time TRL, which is from the time when the /RAS signal is activated to the time when the transfer gate control signal LW is activated, is shorter than the first delay time TWD1, the transfer gate 15 is turned on before the predetermined time T1 is passed after the word line WL is set to be in the activated state, whereby data transfer from the sense amplifier 14 to the data latch circuit 16 is ended. In this case, the row decoder 12 is automatically controlled such that the word line WL is automatically set to be in the inactive state before passing the predetermined first fixed time T1.

Therefore, according to the DRAM of FIG. 8, the timing of the transfer gate control signal LW is controlled such that the delay time TRL, which is from the time when the /RAS signal is activated to the time when the transfer gate control signal LW is activated, is shorter than the first delay time TWD1. Thereby, the second delay time TWD2, which is from the time the when the /RAS signal is activated to the time when the word line WL is inactivated, can be set to be shorter than the first delay time TWD1. Therefore, there can be further reduced the duty ratio of the time in which the word line level voltage is applied to the gate insulating film of the charge transfer MOS transistor of the memory cell connected to the word line WL to the total operating time.

For the period of time when the transfer gate control signal LW is activated and the transfer gate 15 is turned on, the potentials of the bit line pair (BL, /BL) are influenced by the data latch circuit 16 (the potentials are also influenced by the data bus load circuit 21 for the period of time when the column selection gate 19 is turned on). Due to this, the potentials of the bit line pair (BL, /BL) fall as compared with the power supply voltage Vcc or rise as compared with a ground voltage Vss. If the word line WL is inactivated in this state, shortage of amount of electrical charge for rewriting to the memory cell is brought about, and increase of a soft error rate is caused.

In order to prevent generation of such a problem, the word line WL may be prevented from being inactivated in the period of time when the the transfer gate control signal LW is activated. Due to this, the row controller 230b is preferably structured to output the control signal S2 by which the word line WL is automatically set to be in the inactivated state with the second fixed time T2 passing after the word line WL is set to be in the activated state and the transfer gate 15 is controlled to be turned off.

The following will explain the specific example of the row controller 230b of FIG. 8.

The word line controller of the row controller 230b comprises the RAS timer 30, which is the same as the timer circuit of the row controller 230a, a falling edge delay circuit 51, an OR gate 52, a falling edge detection circuit 53, a rising edge delay circuit 54, an inverter 55, and an AND gate 56. The falling edge delay circuit 51 delays the trailing edge (falling edge) of the input of the transfer gate control signal LW by a predetermined third fixed time T3. The OR gate 52 receives an output signal of the falling edge delay circuit 51 and an output of the RAS timer circuit 30. The falling edge detection circuit 53 receives the /RAS signal, the RAST signal which is the output of the /RAS timer circuit 30 and the transfer gate control signal LW to be controlled thereby to detect the falling edge of the transfer gate control signal LW. The rising edge delay circuit 54 receives an output signal of the falling edge detection circuit 53, and delays the front edge (rising edge) by a predetermined second fixed time T2 (T2<T3). The inverter 55 inverts an output of the rising edge delay circuit 54. The AND gate 56 receives an output signal of the inverter 55 and an output signal of the OR gate 52. An output signal S2 of the AND gate 56 is supplied to the row controller 12 and the word line level generator 13.

The following explains the operation of the above-structured row controller 230b with reference to FIG. 9.

The output signal RAST of the RAS timer 30 rises when the /RAS signal is set to be in the activated state. The falling edge detection circuit 53 receives an output signal RAST ("H" level) of the RAS timer 30, the /RAS signal ("L" level), and a LW signal ("L" level). At this time, an output signal DE of the circuit 53 is maintained to be in an "L" level. Then, an output signal DED of the rising delay circuit 54 is set to be in an "L" level, and the output signal of the inverter 55 is set to an "H" level. Then, the output signal S2 of the AND gate 56 to which the output signal RAST ("H" level) of the RAS timer circuit 30 is inputted through the OR gate 52 is set to be in an "H" level. Thereby, the row decoder 12 selects the word line WL, and supplies the word line boosted voltage, which is sent from the word line level generator 13, to the selected word line.

The initial state of the transfer gate control signal LW is in the "L" level. Then, the transfer gate control signal LW is activated (rises) when the delay time TRL passes after the /RAS signal is set to the activated state. After a predetermined time, the transfer gate control signal LW is inactivated (falls). For the period of time when the transfer gate control signal LW is in the "L" level, the output of the LW falling edge detection circuit 53 is in the "L" level, and the output of the LW rising delay circuit 54 is in the "H" level.

In this case, if the delay time TRL, which is from the time when the /RAS signal is set to the activated state to the time when the transfer gate control signal LW is activated, is longer than the first delay time TWD1, the output signal RAST of the RAS timer 30 falls before passing the first delay time TWD1 (not shown). The output signal RAST is inputted into the row decoder 12 and the word line level generator 13 through the OR gate 52 and the AND gate 56, and the row decoder 12 inactivates the selection word line WL. Therefore, it is so operated that the time for activating the word line WL is limited to the first fixed time T1. By receiving the "L" level output of the RAS timer 30, the LW falling edge detection circuit 53 is inactivated to output "H" level. Then, after the predetermined second fixed time T2, the output of the LW rising edge delay circuit 54 is set to the "H" level and the output of the inverter 55 is set to the "L" level. Thereafter, even if the transfer gate control signal LW rises, the output signal DE of the LW falling edge detection circuit 53 is maintained to be in the "H" level, the output signal DED of the rising edge delay circuit 54 is maintained to be in the "H" level, the output of the inverter 55 is maintained to be in the "L" level, and the output signal S2 of the AND gate 56 is maintained to be in the "L" level. Due to this, the row decoder 12 does not activate the word line WL until the /RAS signal is set to the activated state again.

In contrast, if the delay time TRL, which is from the time when the /RAS signal is set to the activated state to the time when the transfer gate control signal LW is activated, is shorter than the first delay time TWD1, the LW rising edge detection circuit 53 is activated by receiving "H" level signal of the output RAST of the RAS timer 30, and outputs the "L" level signal. Thereafter, at the time when the falling edge of the transfer gate control signal LW is detected, the output signal DE is inverted to the "H" level. Then, after the predetermined second time T2, the output DED of the LW rising delay circuit 54 is set to the "H" level, and the output of the inverter 55 is set to the "L" level. Thereby, since the output signal S2 of the AND gate 56 is set to the "L" level, the row decoder 12 inactivates the selected word line WL. Therefore, it is so operated that the activated time of the word line WL is limited to a value which is smaller than the first fixed time T1.

For the period of time when the transfer gate control signal LW is activated and the transfer gate 15 is turned on, the potentials of the pair of the bit lines (BL, /BL) are influenced by the data latch circuit 16 (the potentials are also influenced by the data bus load circuit 21 for the period of time when the column selection gate 19 is turned on). Due to this, the potentials of the pair of the bit lines (BL, /BL) fall as compared with the power supply voltage Vcc or rise as compared with the ground voltage Vss. According to the structure of this embodiment, even in such a state, it is controlled that the word line WL is set to be in the inactivation state after the predetermined second time T2 since the time when the falling edge of the transfer gate control signal LW is detected. Due to this, shortage of amount of electrical charge for rewriting to the memory cell is not brought about.

If the transfer gate control signal LW is activated, the output signal LWD of the LW falling delay circuit 51 is set to be in the "H" level. Then, after the transfer gate control signal LW falls, the output signal LWD of the LW falling delay circuit 51 is set to be in the "L" level at the predetermined third time T3 (>T2) later. Therefore, until the predetermined third time T3 passes since the activated transfer gate control signal LW is inactivated, the output of the OR gate 52 is maintained to be in the "H" level. Due to this, even if the output signal RAST of the RAS timer 30 is set to be in the "L" level during this period of time, the output of the OR gate 52 is maintained to be in the "H" level. Also, the output S2 of the AND gate 56 is maintained to be in the "H" level until the output of the inverter 55 is in the "L" level after passing the predetermined second time T2 since the time when the transfer gate control signal LW is inactivated.

In other words, the LW falling edge delay circuit 51, the LW rising edge detection circuit 53, the rising delay circuit 54, the inverter 55, and the AND gate 56 detect the time in which the transfer gate control signal LW is turned off after the word line WL selected by the row decoder 12 is set to be in the activated state followed by turning-on of the transfer gate control signal LW. If the detected time is before the first delay time TWD1, the signal S2 is outputted such that the row decoder 12 is controlled to inactivate the selected word line WL in place of (prior to) the output signal of the RAS timer 30.

FIG. 10 shows an example of the falling edge delay circuit 51. The transfer gate control signal LW is inputted to the input terminal IN1, and the delayed signal LWD is outputted to the output terminal OUT1. The input signal is inverted by an inverter 111, and inputted to one input terminal of an NAND gate 112. Also, a delayed signal, which is formed by a delay circuit comprising inverters 113, 114, and capacitors 115 and 116, is inputted to the other input terminal of the NAND gate 112. Thereby, a signal LWD, whose falling edge is delayed by the third fixed time T3, is generated at an output terminal of the NAND gate 112.

FIG. 11 shows an example of the rising edge delay circuit 54. The output signal DE of the falling edge detection circuit 53 is inputted to the input terminal IN2, and the delay signal DED is outputted to the output terminal OUT2. The input signal is inverted by an inverter 121, and inputted to one input terminal of an NOR gate 122. Also, a signal, which is delayed by a delay circuit comprising inverters 123, 124, and capacitors 125 and 126, is inputted to the other input terminal of the NOR gate 122. Thereby, a signal DED, whose falling edge is delayed by the second fixed time T2, is generated at an output terminal of the NOR gate 122.

FIG. 12 shows an example of the falling edge detection circuit 53. The output signal RAST of the timer circuit 30 is inputted to one input terminal of the AND gate, which comprises NAND gate 131 and an inverter 132, through an input terminal IN3. The transfer gate control signal LW is inputted one input terminal of a NOR gate 135 through an input terminal IN4. An input terminal IN5, to which the /RAS signal is inputted, is connected to one input terminal of a flop-flop comprising NOR gates 133 and 134, which are cross-coupled. An output terminal of the flip-flop is connected to the other input terminal of the NOR gate 135. The output terminal of the NOR gate 135 is connected to the other input terminal of the NAND gate 131. If the RAS signal is in the "L" level and the LW signal is changed from "H" level to "L" level, the output of the NOR gate 135 is changed from "L" level to "H" level. At this time, if the RAST signal is in the "H" level, the output terminal OUT3 is changed from "L" level to "H" level, and the falling of the LW signal is detected. In other words, the falling of the LW signal is detected only when the RAST signal is in the "H" level. The /RAS signal of the input terminal IN5 is used to reset the output terminal OUT3 (DE signal) to the "L" level when the /RAS signal is changed from the "L" level to "H" level (/RAS signal is inactivated).

(Third Embodiment)

FIG. 13 shows the structure of the main parts of the DRAM with data latch of a third embodiment of the present invention. The DRAM of the third embodiment is different from that of the second embodiment in the following points.

More specifically, similar to a pipe-line operation system, which is used in a synchronous DRAM which is operated by a high speed clock signal, there is provided a system in which each of a column signal line and a transfer gate signal transmission line performs a pipeline operation in synchronization with a clock signal from an outer section. The transfer gate signal transmission line is divided into a plurality of stages. The row controller 230c is controlled by the control signals of a plurality of the stages of the transfer gate signal transmission line. The remaining structure of the DRAM of the third embodiment is the same as the structure of the DRAM of the second embodiment.

In FIG. 13, reference numeral 221 is an internal transfer gate buffer. The internal transfer gate buffer 221 receives the output signal LW1 of the transfer gate control signal buffer 22, and generates an internal transfer gate control signal LWi to be supplied to the transfer gate 15. Reference numeral 71 is a clock buffer circuit. The clock buffer circuit 71 distributes an clock signal inputted from the outer section into the column address buffer 17, the column decoder 18, the I/O buffer 20, the transfer gate (LW) buffer 22, and the internal transfer gate (LW) buffer 221. The /RAS signal is inputted to the row controller 230c. Also, the output signal LWi of the internal transfer gate buffer 221, which directly controls the output signal LW1 of the transfer gate buffer 22 and the transfer gate 15, is inputted to the row controller 230c. The row controller 230c is structured to perform basically the same operation as the row controller 230b of the second embodiment.

The following explains a specific example of the row controller 230c of FIG. 13 with reference to FIG. 14.

The row controller 230c comprises the RAS timer circuit 30, which is the same as the RAS timer circuit of the row controller 230a, a LWi falling edge delay circuit 81, a first OR gate 82, a second OR gate 83, a LWi falling edge detection circuit 84, a LWi rising edge delay circuit 85, an inverter 86, and an AND gate 87. The falling edge delay circuit 81 receives the control signal LWi from the internal gate buffer 221, and delays the trailing edge (falling edge) by the predetermined third time T3 (>T2). The first OR gate 82 receives the output of the LWi falling edge delay circuit 81 and the control signal LW1 of the transfer gate buffer 22. The OR gate 83 receives the output signal of the first OR gate 82 and the output signal of the RAS timer circuit 30. The LWi falling edge detection circuit 84 receives the control signal LWi of the internal transfer gate buffer 221, /RAS signal and RAST signal which is the output signal of the RAS timer 30, and detects the falling edge of the control signal LWi. The rising delay circuit 85 receives the output signal DE of the LWi falling edge detection circuit 84, and delays the front edge (rising edge) by the predetermined second time T2. The inverter 86 inverts the output signal of the LWi rising edge delay circuit 85. The AND gate 87 receives the output of the inverter 86 and the output signal of the second OR gate 83. The output signal of the AND gate 87 is supplied to the row decoder 12 and the word line level generator 13.

The operation of the above-structured row controller 230c differs, depending on whether the period of time, which is from the time when the /RAS signal is set to be in the activated state to the time when the transfer gate control signal LW is activated is longer or shorter than the first delay time TWD1.

In other words, if the period of time, which is from the time when the /RAS signal is set to be in the activated state to the time when the transfer gate control signal LW is activated is longer than the first delay time TWD1, the period of time for activating the word line WL is limited to the first fixed time T1, similar to the readout operation of the DRAM of the first embodiment.

On the other hand, if the period of time, which is from the time when the /RAS signal is set to be in the activated state to the time when the transfer gate control signal LW is activated is shorter than the first delay time TWD1, the control signal LWi of the second stage of the transfer gate signal transmission line is activated before the predetermined first time T1 passes after the word line WL is set to be in the activated state. Thereby, the transfer gate 15 is turned on, and the data transfer from the sense amplifier 14 to the data latch circuit 16 is ended. In this case, similar to the DRAM of the second embodiment, the row controller 12 is controlled such that the word line WL is automatically set to be in the inactivated state before the predetermined first time T1 passes. Moreover, if the control signal LW1 of the first stage of the transfer gate signal transmission line is activated, it is estimated that the control signal LWi of the second stage is activated after one clock cycle. Then, it is possible to output a control signal S3 for controlling the row decoder 12 to automatically set the word line WL to be in the inactivated state after at least two clock cycles are passed.

FIG. 15 is a waveform view showing one example of the readout operation of the DRAM of FIG. 14. In the DRAM of FIG. 14, the input of the transfer gate control signal LW propagates the pipe-line stage one by one every one clock cycle. In other words, after the /RAS signal is set to be in the activated state, the input of the transfer gate control signal LW is fetched to the transfer gate buffer 22 at the timing of the rising of, for example, a fifth clock cycle. Thereby, the control signal LW1 of the first stage rises. Moreover, the "H" level of the control signal LW1 is fetched to the transfer gate buffer 221 by the timing of the rising of, for example, a sixth clock cycle, so that the control signal LWi of the second stage rises.

In the readout operation of the DRAM of FIG. 14, the basic method of the word line control is the same as the DRAM of the second embodiment. However, the row controller 230c is controlled by the control signal WL1 of the first stage and the control signal LWi of the second stage, which directly controls the transfer gate 15, among the plurality of stages of the transfer gate signal transmission line.

If the time when the transfer gate 15 is controlled to be turned on by the control signal LWi of the second stage and the timing when the word line WL is inactivated by the row controller 12 which is controlled by the row controller 230c are the same, there is possibility that the following problem will occur.

Specifically, the potentials of the pair of the bit lines (BL, /BL) fall as compared with the power supply voltage Vcc or rise as compared with the ground voltage Vss for the period of time when the transfer gate 15 is turned on. Due to this, shortage of amount of electrical charge for rewriting to the memory cell may be brought about.

However, according to the row controller 230c of the third embodiment, the rise of the second stage control signal LWi can be estimated by the rise of the control signal LW1 of the first stage at the time of one clock cycle before the control signal LWi of the second stage. Therefore, it is possible to control to correctly delay timing for inactivating the word line WL by the output signal S3 of the row controller 230c during the state that the control signal LWi is activated and the transfer gate 15 is turned on.

Thereby, the timing for inactivating the word line WL can be correctly delayed after the state that the transfer gate 15 is turned on. Therefore, even if the potentials of the pair of the bit lines (BL, /BL) fall as compared with the power supply voltage Vcc or rise as compared with the ground voltage Vss, no shortage of amount of electrical charge for rewriting to the memory cell is caused.

The /RAS timer 30, the falling edge delay circuit 81, the rising edge detection circuit 84, the rising edge delay circuit 85, which are used in the row controller 230c can be structured to be the same as the corresponding circuits of the first or second embodiment.

In the static data latch circuit 16 shown in the above embodiments, there is an advantage in that refresh of the latch operation is not needed since a stored data is not lost with the passage of time. However, since the PMOS transistors P3, P4, and NMOS transistors N3 and N4 are used, there is needed an isolation region for electrically isolating an N well, serving as a substrate region for forming PMOS transistor, and a P well, serving as a substrate region for forming NMOS transistor, from each other. Due to this, increase in the chip size of the DRAM may be brought about.

In order to avoid the generation of the above problem, if a dynamic data latch circuit in which two MOS transistors of the same conductivity are cross-coupled is used, the structure is simple, and the isolation region for electrically isolating the MOS transistors of the different conductivity from each other is not needed, so that no increase in the chip size of the DRAM may be brought about. However, in the dynamic data latch circuit, since a stored data is lost with the passage of time, refresh control is needed to refresh the latched data.

Moreover, in the data bus load circuit 21, the NMOS transistor may be used in place of the PMOS transistor. Then, the NMOS transistor may be controlled by the load control signal LDE whose level is inverted against the load control signal /LDE.

As mentioned above, according to the DRAM with a data latch of the present invention, the duty ratio of the time when the word line boosted voltage is applied to the gate insulating film of the charge transfer MOS transistor of the memory cell connected to the word line to the total time is smaller than the conventional case. Also, the long period of reliability of the gate insulating film can be attained readily, test time for performing the screening test of the the gate insulating film can be shortened, and test cost can be reduced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:

a memory cell array including a plurality of dynamic memory cells, each having a data storage capacitor and a MOS transistor for an electrical charge transfer gate, arranged in a form of rows and columns;

a plurality of word lines connected to said memory cells of said memory cell array in a direction of said rows;

a row decoder for decoding a row address signal in synchronization with a /RAS signal for selecting one of said word lines corresponding to an arbitrary one of said rows of said memory cell array;

a plurality of sense amplifiers, provided to have the same number as the number of said columns of said memory cell array, for sensing data read out from said memory cells connected to said one of said word lines selected by said row decoder through a plurality of bit lines, respectively;

a plurality of transfer gates connected to said sense amplifiers, respectively;

a plurality of data latch circuits, provided to have the same number as the number of said columns of said memory cell array and connected to said transfer gates, respectively, to latch said data sensed by said sense amplifiers through said transfer gates;

a plurality of column selection gates connected to said data latch circuits, respectively, for selecting at least one of said data latch circuits;

a column decoder for decoding a column address signal for selecting an arbitrary one of said columns of said memory cell array to switch-control said column selection gates; and a row controller controlling said row decoder so as to activate said one of said word lines selected by said row decoder and sequentially inactivate the same at a predetermined timing, said predetermined timing falling within the period of time after said sense amplifiers are stabilized in an activated state and before said /RAS signal is inactivated.

2. The device according to claim 1, further comprising:

an I/O buffer for receiving and transferring I/O data from and to said one of said data latch circuits selected by said column selection gates;

a data bus for connecting said I/O buffer to said column selection gates; and a load circuit connected between said data bus and a power source.

3. The device according to claim 1, wherein said row controller controls said row decoder in such a manner that said one of said word lines selected by said row decoder is automatically set to be in an inactivated state at the predetermined timing after said one of said word lines is activated, and said sense amplifiers are controlled to start an sensing operation after said one of said word lines is set to be in the activated state, and holds said data until said sense amplifiers are set to be in a precharge state by an outer section after said one of said word lines is inactivated.

4. The device according to claim 2, wherein said row controller controls said row decoder in such a manner that said one of said word lines selected by said row decoder is automatically set to be in an inactivated state at the predetermined timing after said one of said word lines is activated, and said sense amplifiers are controlled to start an sensing operation after said one of said word lines is set to be in the activated state, and holds said data until said sense amplifiers are set to be in a precharge state by an outer section after said one of said word lines is inactivated.

5. The device according to claim 1, wherein said row controller controls said predetermined timing so as to fall within a period of time after said one of said word lines is set to be in the activated state and said sense amplifiers are stabilized in the activated state and before a data transfer from said sense amplifiers to said data latch circuits is started.

6. The device according to claim 2, wherein said row controller controls said predetermined timing so as to fall within a period of time after said one of said word lines is set to be in the activated state and said sense amplifiers are stabilized in the activated state and before a data transfer from said sense amplifiers to said data latch circuits is started.

7. The device according to claim 1, wherein said row controller controls said predetermined timing so as to fall within a period of time after said one of said word lines is set to be in the activated state, said sense amplifiers are stabilized in the activated state and also a data transfer from said sense amplifiers to said data latch circuits is ended, and before said /RAS signal is inactivated.

8. The device according to claim 2, wherein said row controller controls said predetermined timing so as to fall within a period of time after said one of said word lines is set to be in the activated state, said sense amplifiers are stabilized in the activated state and also a data transfer from said sense amplifiers to said data latch circuits is ended, and before said /RAS signal is inactivated.

9. A semiconductor memory device comprising:
- a memory cell array including a plurality of dynamic memory cells, each having a data storage capacitor and a MOS transistor for an electrical charge transfer gate, arranged in a form of rows and columns;
- a plurality of word lines connected to said memory cells of said memory cell array in a direction of said rows;
- a row decoder for decoding a row address signal in synchronization with a /RAS signal for selecting one of said word lines corresponding to an arbitrary one of said rows of said memory cell array;
- a plurality of sense amplifiers, provided to have the same number as the number of said columns of said memory cell array, for sensing data read out from said memory cells connected to said one of said word lines selected by said row decoder through a plurality of bit lines, respectively;
- a plurality of transfer gates connected to said sense amplifiers, respectively;
- a plurality of data latch circuits, provided to have the same number as the number of said columns of said memory cell array and connected to said transfer gates, respectively, to latch said data sensed by said sense amplifiers through said transfer gates;
- a plurality of column selection gates connected to said data latch circuits, respectively, for selecting at least one of said data latch circuits;
- a column decoder for decoding a column address signal for selecting an arbitrary one of said columns of said memory cell array to switch-control said column selection gates; and
- a row controller controlling a timing for setting said one of said word lines in the inactivated state to be changed in accordance with whether or not a data transfer from said sense amplifiers, which are stabilized in the activated state, to said data latch circuits is ended before a predetermined first fixed time passes since said one of said word lines selected by said row decoder is activated.

10. The device according to claim 9, further comprising:
- an I/O buffer for receiving and transferring I/O data from and to said one of said data latch circuits selected by said column selection gates;
- a data bus for connecting said I/O buffer to said column selection gates; and
- a load circuit connected between said data bus and a power source.

11. The device according to claim 10, wherein when the data transfer from said sense amplifiers to said data latch circuits is not ended before said first fixed time passes since said one of said word lines selected by said row decoder is activated, said row controller controls said row decoder in such a manner that said one of said word lines is automatically set to be in the inactivated state just after said first fixed time passes, and when the data transfer from said sense amplifiers to said data latch circuits is ended before said first fixed time passes since said one of said word lines selected by the said row decoder is activated, said row controller controls said row decoder in such a manner that said one of said word lines is automatically set to be in the inactivated state before said first fixed time passes.

12. The device according to claim 10, wherein said row controller controls a timing of inactivating said one of said word lines automatically before said first fixed time passes so as to be at a time after a predetermined second fixed time passes since said transfer gates are turned off.

13. The device according to claim 11, wherein said row controller controls a timing of inactivating said one of said word lines automatically before said first fixed time passes so as to be at a time after a predetermined second fixed time passes since said transfer gates are turned off.

14. The device according to claim 11, said row controller comprises:
- a timer circuit receiving said /RAS signal to output a pulse signal having a predetermined time width necessary for setting said first fixed time, which is shorter than a pulse width of said /RAS signal, in synchronization with a front pulse edge of said /RAS signal;
- a detecting circuit for detecting whether said transfer gates are turned on or off before said first fixed time passes since said one of said word lines is activated; and
- a circuit for controlling said row decoder by outputting a control signal to inactivate said row decoder, whose timing is made same as that of an output signal of said timer circuit when said detecting circuit detects that said transfer gates are turned off.

15. The device according to claim 11, said row controller comprises:
- a timer circuit receiving said /RAS signal to output a pulse signal having a predetermined time width necessary for setting said first fixed time, which is shorter than a pulse width of said /RAS signal, in synchronization with a front pulse edge of said /RAS signal;
- a detecting circuit for detecting whether said transfer gates are turned on or off before said first fixed time passes since said one of said word lines is activated; and
- a circuit for controlling said row decoder by outputting a control signal to inactivate said row decoder, whose timing is made faster than that of an output signal of said timer circuit when said detecting circuit detects that said transfer gates are turned on.

16. The device according to claim 11, said row controller comprises:
- a timer circuit receiving said /RAS signal to output a pulse signal having a predetermined time width necessary for setting said first fixed time, which is shorter than a pulth width of said /RAS signal in synchronization with a front pulse edge of said /RAS signal;
- a falling edge delay circuit receiving a transfer gate control signal to delay the falling edge thereof by a predetermined third fixed time, which is longer than said second fixed time;
- a first logic circuit receiving an output signal of said falling edge delay circuit and an output signal of said timer circuit to obtain a logical OR therebetween as an output signal thereof;
- a falling edge detection circuit receiving said /RAS signal, said transfer gate control signal and an output signal of said timer circuit to detect the falling edge of said transfer gate control signal;

a rising edge delay circuit receiving an output signal of said falling edge detection circuit to delay said falling edge by a predetermined second fixed time; and a second logic circuit for controlling a passage of said output signal of said first logic circuit using an output signal of said rising edge delay circuit.

17. The device according to claim 1, wherein said column decoder and said row controller perform a pipe-line operation in synchronization with a clock signal from an outer section, said transfer gate control signal is divided into a plurality of subcontrol signals, and said row controller is controlled by said subcontrol signals divided from said transfer gate control signal.

18. The device according to claim 2, further comprising:

a transfer gate buffer circuit receiving said transfer gate control signal to output a signal for controlling said row controller and said transfer gate; and a column address buffer circuit receiving said column address signal to output said column address signal to said column decoder, wherein said transfer gate buffer circuit, said column address buffer circuit, said row controller, said column decoder, and said I/O buffer are divided into a plurality of stages for performing a pipe-line operation in synchronization with a clock signal from an outer section;

said transfer gate buffer circuit is divided into a plurality of stages including a first stage for controlling said row controller and a second stage for directly controlling said transfer gate in addition to said row controller; and said row controller controls said row decoder in such a manner that after said one of said word lines selected by said row decoder is activated and a transfer gate control signal in said second stage is temporarily activated before a predetermined first fixed time passes, said one of said word lines is automatically set to be in the inactivated state a predetermined second fixed time later since said transfer gate control signal in said second stage is inactivated.

\* \* \* \* \*